United States Patent
Degroote

(10) Patent No.: US 7,393,768 B2
(45) Date of Patent: Jul. 1, 2008

(54) ETCHING OF STRUCTURES WITH HIGH TOPOGRAPHY

(75) Inventor: Bart Degroote, Oud-Heverlee (BE)

(73) Assignee: Interuniversitair Microelektronica Centrum (IMEC) vzw, Leuven (BE)

( * ) Notice: Subject to any disclaimer, the term of this patent is extended or adjusted under 35 U.S.C. 154(b) by 0 days.

(21) Appl. No.: 11/227,703

(22) Filed: Sep. 14, 2005

(65) Prior Publication Data
US 2006/0110928 A1 May 25, 2006

Related U.S. Application Data

(60) Provisional application No. 60/617,145, filed on Oct. 7, 2004.

(51) Int. Cl.
*H01L 21/3205* (2006.01)
*H01L 21/4763* (2006.01)

(52) U.S. Cl. .................. 438/585; 438/694; 438/697; 257/E21.245; 257/E21.305

(58) Field of Classification Search .............. 438/689, 438/694, 697, FOR. 388, 585
See application file for complete search history.

(56) References Cited

U.S. PATENT DOCUMENTS

| | | | |
|---|---|---|---|
| 4,601,781 A | 7/1986 | Mercier et al. | |
| 5,402,002 A * | 3/1995 | Meister et al. | 257/586 |
| 5,418,176 A | 5/1995 | Lee et al. | |
| 5,792,694 A | 8/1998 | Park | |
| 6,028,362 A * | 2/2000 | Omura | 257/774 |
| 6,277,754 B1 | 8/2001 | Wang et al. | |
| 6,426,558 B1 * | 7/2002 | Chapple-Sokol et al. | 257/758 |
| 6,787,476 B1 | 9/2004 | Dakshina-Murthy et al. | |
| 2003/0073303 A1 * | 4/2003 | Iida et al. | 438/623 |
| 2004/0023500 A1 * | 2/2004 | Dokumaci et al. | 438/694 |
| 2004/0048472 A1 * | 3/2004 | Wieczorek et al. | 438/689 |
| 2004/0248396 A1 * | 12/2004 | Iida et al. | 438/623 |
| 2004/0265745 A1 * | 12/2004 | Sho et al. | 430/311 |
| 2005/0079702 A1 * | 4/2005 | Popp et al. | 438/626 |

OTHER PUBLICATIONS

Yang, et al. *5nm-Gate Nanowire FinFET*, 2004 Symposium on VLSI Technology Digest of Technical Papers. pp. 196-197.
European Search Report for related Eurpoean Application No. EP 05447052.1, mailed on Feb. 8, 2006.

* cited by examiner

*Primary Examiner*—Michelle Estrada
(74) *Attorney, Agent, or Firm*—Knobbe Martens Olson & Bear LLP

(57) ABSTRACT

The present invention relates to a method for the patterning of a stack of layers on a surface with high topography. A method of the present invention can be used for gate patterning for multiple Gate FETs (MuGFETs), for patterning of the control gate in non-volatile memory applications, and for the patterning of the poly emitter in BiCMOS devices. The present invention also relates to a device prepared by a method of the invention.

18 Claims, 11 Drawing Sheets

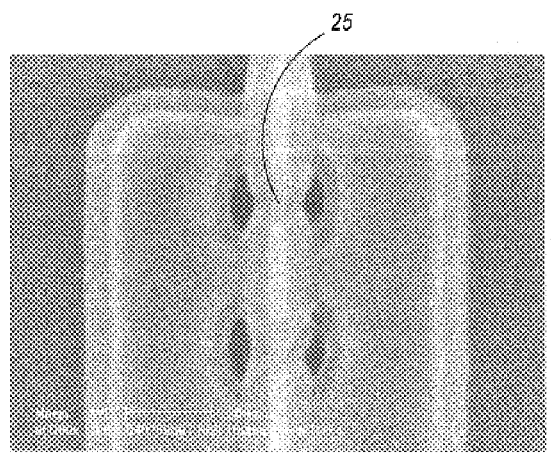 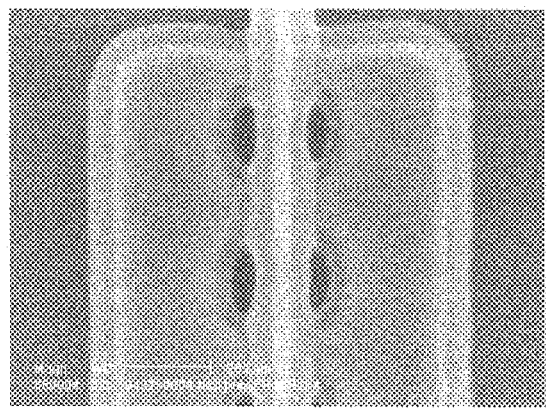
FIG. 7A
FIG. 7B

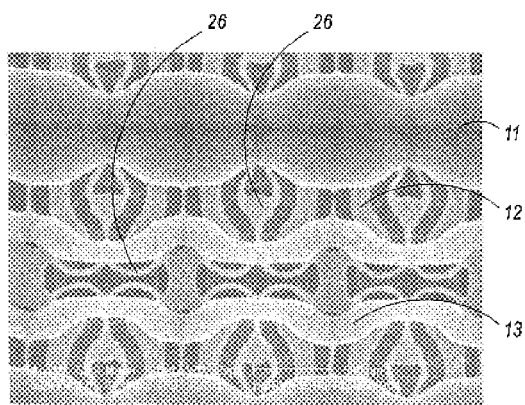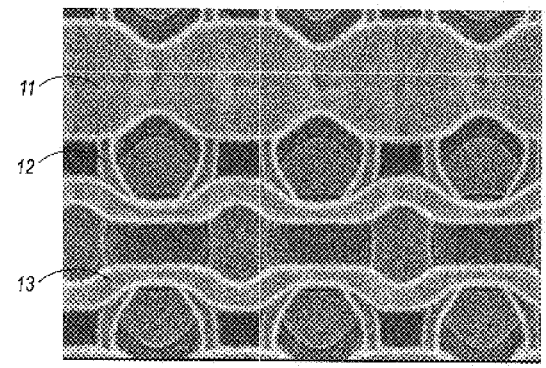
FIG. 9A                    FIG. 9B

ETCHING OF STRUCTURES WITH HIGH TOPOGRAPHY

CROSS-REFERENCE TO RELATED APPLICATIONS

This application claims priority under 35 U.S.C. § 119(e) to U.S. Provisional Application No. 60/617,145, filed Oct. 7, 2004. The above-referenced prior application is incorporated by reference herein in its entirety and is hereby made a portion of this specification.

FIELD OF THE INVENTION

The present invention is related to the field of semiconductor processing. The present invention is related to the field of patterning of structures within a semiconductor device with high topography. The present invention relates to dry etching of structures with high topography on a semiconductor device. The present invention also relates to a device obtainable by a method of the invention.

BACKGROUND OF THE INVENTION

In the fabrication process of classical CMOS devices, topography has always been reduced as much as possible in order to facilitate the patterning of the different levels, affecting the quality of both lithography and dry etching steps. The development of Shallow Trench Isolation or STI (used for active area pitches in the sub-0.5 µm regime) and, more specifically, the reduction of the 'STI ditch' at the border between active area and field is a typical example in this context. Gate patterning is another example of such a critical application.

In general, topography consists of two facets: the level difference on local scale and the slope of the surface caused by this level difference. The former compromises the lithographic illumination conditions because sufficient Depth of Focus (DOF) is required. From (anisotropic) dry etch point of view, both level difference and slope determine the final process window. In the neighborhood of a topography step a deposited, grown, or spin-coated layer is locally thicker in the direction perpendicular to the wafer compared to this layer on a flat surface. The steeper the slope and the larger the level difference, the longer over-etch is needed to clear out the residual parts of the layer next to the topography steps. Referring back to the example of the STI ditch, during gate etch, a sufficiently long over-etch is needed to remove poly-Si residues, which requires high selectivity towards the gate oxide and adequate profile control (e.g., to prevent notching).

In many cases topography reduction is not straightforward. In Non-Volatile Memory (NVM) applications, the control gate level is patterned as a three-dimensional structure on top of the floating gate. A reduced topography can be achieved by patterning the floating gate with a sloped profile (typically between 80 and 85 degrees). However, the height of the floating gate is fixed by the technology node (e.g., 125 nm for 0.13 µm technology), and the overall topography remains very pronounced.

In some cases topography is a crucial part of the device architecture, e.g., for Multi-Gate devices which are regarded as possible alternatives for classical CMOS devices in sub 45-nm technologies. The term "Multi-Gate device" or "MuGFET" refers to a family of devices known in literature as FinFETs, Tri-gate, Omega-gate, Pie-gate, and the like. The potential advantage of these devices is their superior short-channel effect (SCE) control over bulk devices in the sub-30 nm physical gate length regime. Important issues in the fabrication of these devices are, e.g., the patterning of 25 nm gates over high topography due to the fins. In MuGFETs the active area is patterned from an SOI (Silicon On Insulator) layer of the order of tens of nm thick, and consists of source and drain connected by 'fins'. Narrow fins are required to have a better short channel effect control. Typically the fin width should be about half of the gate length. The channel width on the other hand is determined by the height of the fin—the higher the fin, the more current can flow from source to drain. Therefore the gate stack is deposited on a surface with an intrinsically high topography.

One of the key issues of gate patterning for MuGFETs is the high topography involved. The FIN heights are of the order of 50 to 100 nm, and recess in the BOX (Buried Oxide Layer) can result in extra topography, from a few nm to several tens of nanometers. As a consequence, the selectivity of the etch chemistries used for gate patterning become more critical than compared to planar gate etch. For each layer that needs to be etched, a sufficiently long over-etch is required to clean up any residues at topography steps while at the same time damage to already patterned layers must be avoided.

The patterning of the gate for MuGFETs consists of four basic steps. First several layers are deposited (or grown/coated) on the initial surface: the layer(s) that need(s) to be patterned (e.g. poly-Si or a stack of metals to define the gate); sacrificial layers (e.g. stopping layer, hard mask); and litho-related layers (e.g. Bottom Anti Reflective Coating or BARC, resist). Second, the wafer is illuminated and the resist developed. Subsequently the wafer is etched to transfer the resist pattern into the relevant layer(s) stopping on the initial surface. In the fourth and last step, any sacrificial material (e.g. resist, hard mask) is removed. As mentioned before, the presence of topography steps narrows down the process window for both lithography and dry etch. Since the topography itself in many cases can only be reduced to some extent, other options have to be explored to open up the process window as much as possible.

One approach that has been used to avoid problems related to the etching of layers with high topography is Chemical Mechanical Polishing (CMP) to planarize the surface of one of the layers that is deposited on the initial surface. This is certainly a huge improvement from lithographic point of view with respect to DOF. From dry etch point of view this approach has the advantage that any layer that is deposited on top of this planarized layer (e.g., hard mask on top of CMP-ed poly-Si used for gate patterning) can be removed with minimal over-etch. Yang et al. (Symp. on VLSI Technology 2004 pp. 196) have successfully applied this approach to pattern a poly-Si gate with a CD of 5 nm (using hard mask trimming) on top of a nanowire FinFET structure. The level difference between the top of the fin and the BOX is about 15 nm, whereas the poly thickness is about 60 nm. Nevertheless, there are two serious drawbacks of the CMP approach. First, the uniformity and reproducibility of the CMP process are difficult to control since there is no stopping layer. Second, as the etch front is planar, the higher-level parts of the initial surface will be exposed sooner to the etch plasma. In the case of MuGFET poly-Si gate patterning this means that source, drain and fin become exposed to the plasma when there is still a relatively thick poly-Si layer present on field areas. On the one hand this complicates the use of endpoint triggering (typically used for planar gate etch) and on the other hand it is problematic for the removal of the remaining poly-Si—etch chemistries with very high selectivity to gate oxide tend to have poor profile control and a very small etch rate (especially when considerable amount of poly-Si is exposed to the plasma).

U.S. Pat. No. 6,787,476 by Dakshina-Murthy et al. describes the use of a stopping layer in between two layers where the removal of the upper layer causes selectivity problems with respect to the lower layer (due to the long over-etch needed because of topography). This approach was used for MuGFET gate etch, and more specifically for an ARC (Anti-Reflective Coating) layer (e.g., SiN) on poly-Si. The stopping layer consists of Ti or TiN because these materials have a very low etch rate in a fluorine etching process, such as, for example, a $CF_4$/Ar etching process for which the ARC layer and poly-Si have a high etch rate. Subsequent to etching of the ARC, the etch stop layer and poly-silicon material of the gate may be etched using, for example, a $Cl_2$/HBr etching process. This approach has the overall disadvantage that an additional layer is added to the stack—after gate etch it needs to be removed with sufficient selectivity towards materials like poly-Si and oxide, which complicates the process flow. Another disadvantage is the fact that the etch chamber becomes metal contaminated. During front-end-of-line CMOS processing metal contamination is avoided when possible. The metallic stopping layer used here is not a part of the gate itself but only used for patterning purposes. If an alternative without metal contamination is possible, then this is more preferable.

Dakshina-Murthy et al. propose an additional approach to tackle the problem of topography for MuGFET gate etch. First, the gate oxide and the poly-Si layer are deposited on the initial surface with active area. On top, an endpoint layer (e.g., Ti or SiGe) is deposited followed by an additional poly-Si layer or possibly another material (not specified). First the additional layer is etched on endpoint, stopping on the Ti or SiGe layer, resulting in spacers next to topography steps. These spacers reduce the slope of the topography and therefore less ARC OE is needed. From this point onwards, the rest of the patterning is continued (possibly with the use of a Ti or TiN stopping layer suggested before). Also, this second proposal by Dakshina-Murthy et al. has disadvantages because again extra layers are added to the stack and in addition, an etch on endpoint to create spacers next to the topography steps is needed. This complicates the process flow even more than in the case of their first proposal. The gate etch itself becomes more complicated with respect to selectivity towards the spacer material. Finally, if Ti is used as a stopping layer, then the etch platform becomes metal contaminated.

SUMMARY OF THE INVENTION

The preferred embodiments provide a method for patterning a stack of layers of a semiconductor device comprising, before depositing the resist layer, (i) the step of depositing at least one layer of said stack thicker than the final aimed/desired thickness upon another layer of said stack, (contiguously or immediately) followed by (ii) the step of (anisotropically) etching back said deposited layer to the aimed/desired thickness.

The deposited and etched back layer and the support layer (the layer underneath) can be of any one of the materials used in the processing of a semiconductor device.

Carrying out the method reduces the steep topography and therefore reduces the over-etch to avoid the presence of residues in the final stack, and in particular to avoid the micromasking phenomenon. Micromasking results in the formation of pins (made of remaining material), which affect the performance of the semiconductor device processed.

In a preferred embodiment, the layer deposited in step (i) is anisotropically etched back in step (ii).

A method according to the preferred embodiments can further comprise, after the step of depositing the resist layer, a lithographic illumination step and a resist development step.

After said resist development step, the step of transferring the resist pattern into the stack of layers can be performed, preferably by means of a plasma etching step.

A method according to the preferred embodiments can further comprise the step of depositing a hardmask layer and/or an anti-reflective coating layer (ARC layer) upon the layer deposited and etched back respectively in step (i) and in step (ii).

Preferably, the height of at least one of the topographic steps is at least half the thickness of one of the layers to be patterned.

The methods of the preferred embodiments can be used for patterning in Multi-Gate devices such as FinFETs, Tri-Gate, Omega-Gate, Pie-Gate device, etc. (e.g., gate patterning), in Non-Volatile Memory applications/devices (e.g., patterning of the control gate), and in BiCMOS applications (e.g., patterning of the poly emitter) and the like.

In methods of the preferred embodiments for patterning gates, in step (i), the layer deposited can be a poly-Si layer. Said poly-Si layer may be deposited upon an active area and/or upon a field oxide.

The layer deposited and etched back can also be a poly-SiGe layer, a nitride layer, an oxide layer or a metal(s) layer.

The deposited layer thickness is preferably a factor of about 1.5 to about 3 higher than the aimed thickness in the final stack.

Also provided is a semiconductor device obtainable by methods of the preferred embodiments.

BRIEF DESCRIPTION OF THE DRAWINGS

All drawings are intended to illustrate some aspects and embodiments of the present invention. Devices are depicted in a simplified way for reason of clarity. Not all alternatives and options are shown and therefore the invention is not limited to the content of the given drawings. Like numerals are employed to reference like parts in the different figures.

FIG. 3F shows poly-Si residues formed at the position where the slope of the poly-Si layer as seen in FIG. 3B was at its steepest.

FIGS. 4A and 4B show a top down view of the gate. FIG. 4D shows another top down view of the gate with critical dimension (CD) of 60 nm over a fin (23) with CD of 40 nm. FIG. 4C shows a cross-sectional view of this structure. FIG. 4E shows another cross-sectional view of this structure, cleaving through a wide gate running parallel to the cleaving plane and perpendicular to the fin (CD of fin=30 nm). In this case, the poly-Si layer (3) was 60 nm thick and an oxide hardmask (4) of 60 nm was used. FIG. 4F shows a tilted view cleaving in between two wide gates. The SEM images are taken before the hardmask (4) was removed and clearly show that micromasking occurs next to topography steps due to oxide hardmask spacers remaining after gate etching. It is clear that the poly-Si 'pins' (22) are formed at the position where the slope of the poly-Si surface was at its steepest.

FIGS. 6A and 6B show a top down view and FIG. 6D another top down view of the gate with critical dimension (CD) of 60 nm over a fin with CD of 40 nm. FIG. 6C shows a cross-sectional view of this structure and FIG. 6E shows another cross-sectional view of this structure, cleaving through a wide gate running parallel to the cleaving plane and perpendicular to the fin (CD of fin=30 nm). The hardmask layer (4) and poly-Si layer (3) are indicated. With the poly etchback approach, the slope of the poly-Si surface is reduced, facilitating the removal of the oxide hardmask spacer i.e. less BT-OE (Break-Through and Over-Etch) and HMT (HardMask Trim) are necessary. FIG. 6F shows a tilted view cleaving in between two wide gates. The fin (23) is indicated. It can be noted that there are no poly-Si residues left after the gate patterning. It can be another (additional) benefit of the etchback approach that the overall line edge roughness can be improved, with straight lines. Comparison with FIG. 4 shows that for one line different line widths are obtained on lower and higher regions. The width on the same line in FIG. 6 is identical, independent of the topography.

FIG. 7A shows a top down SEM picture for gate patterning without etchback approach (100 nm poly-Si over 65 nm high fins with a BOX recess of 10 nm) followed by nitride spacer etch and Ni silicidation in MuGFET applications. The interrupted silicidation (25) is indicated. FIG. 7B shows the result for gate patterning with the etchback approach of the preferred embodiments using the same gate etch recipe, the same nitride spacer etch recipe and the same Ni silicidation as in FIG. 7A. By using the etchback approach of the preferred embodiments, the top surface of the gate was less sloped. As a consequence there are no nitride residues after spacer etch (an additional benefit of the etchback approach in further processing).

FIG. 9A shows the result of gate patterning without etchback approach for Non-Volatile Memory (NVM) applications with a floating gate (12), control gate (13) and program gate (11). Residues are clearly visible on FIG. 9A (26). FIG. 9B shows the result of gate patterning using the etchback approach according to the preferred embodiments for NVM applications. No residues are left on the NVM structure using the etchback approach.

DETAILED DESCRIPTION OF THE PREFERRED EMBODIMENT

Figure 1A:
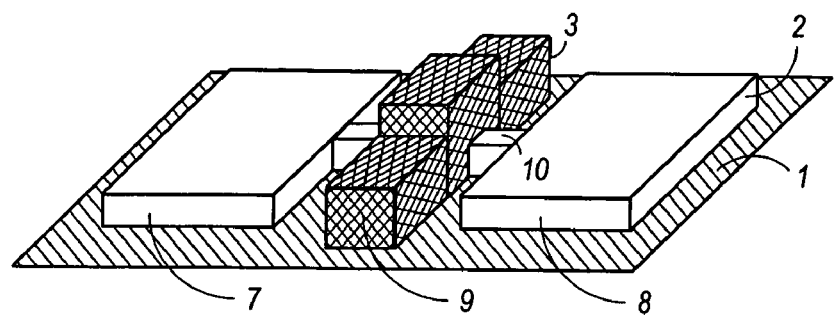
FIG. 1A shows a schematic view representing a poly-Si gate structure for MuGFET. The structure (or stack of layers) comprises a buried oxide layer (1) with an active area (2) on top of it. The active area comprises a source (7), drain (8) and fin (10)) with a gate (9) on top of the fin. The gate is made of poly-Silicon (3).

The following description and examples illustrate a preferred embodiment of the present invention in detail. Those of skill in the art will recognize that there are numerous variations and modifications of this invention that are encompassed by its scope. Accordingly, the description of a preferred embodiment should not be deemed to limit the scope of the present invention.

The preferred embodiments provide a method for patterning/forming a stack of layers of a semiconductor device comprising (i) the step of depositing at least one layer of said stack thicker than the final aimed/desired thickness upon a another layer of said stack, followed by (ii) the step of etching back said deposited layer to said aimed/desired thickness.

The deposited and etched back layer and the layer that supports it (support layer) can be of any one of the materials used in the processing of a semiconductor device.

Preferably, step (i) and step (ii) are contiguous.

Preferably, in step (ii), said deposited layer is anisotropically etched back.

A method according to the preferred embodiments is particularly useful for semiconductor devices showing a high topography.

In the context of the preferred embodiments, the term "high topography" refers to topographic steps/recesses that are more than about 30% the thickness of the layers through which the pattern has to be carried out, or more than (about) 40%, preferably more than about 50%, and more preferably more than about 55%, 60%, 65% or 70%. For example, in a MuGFET the FIN height is of about 70 nm, and the gate is defined out of a poly-Si layer of about 100 nm.

In the context of the preferred embodiments, the term "active area" refers to the region on the surface of a wafer where the source and drain, and for MuGFET devices the fin, are formed, it may also refer to the layer(s) and/or material(s) used for said source, drain and fin.

In the context of the preferred embodiments, the term "field oxide" refers to layer(s) and/or material(s) used to electrically isolate active areas from each other. In a MuGFET device the buried oxide is acting as field oxide.

A method for the patterning of a stack of layers on a surface with high topography is provided, wherein this stack of layers comprises at least two layers. A first layer deposited (upon any support including upon another layer) thicker than the final aimed (or desired) thickness and then (immediately) etched back to the aimed (or desired) thickness. A second layer, which can be defined as a sacrificial layer, deposited upon said first layer.

Said second layer or sacrificial layer, can be of any material that is used in the processing of a semiconductor device, but which is not supposed to remain in the final device, in other words, which is destined to play a specific role before being removed, at least partially or and/or locally (from specific/(pre-)determined areas).

Said first layer can be of any material usually used in the processing of a semiconductor device, including of a sacrificial material.

The preferred embodiments provide thus a method for patterning/forming a stack of at least two layers of a semiconductor device comprising, before depositing at least one sacrificial layer, (i) the step of depositing at least one other layer of said stack thicker than the final aimed/desired thickness, followed by (ii) the step of etching back said at least one other deposited layer to said aimed/desired thickness.

With a method of the preferred embodiments, said sacrificial material can be removed, with no residues left (no spacers), in spite of the high topography, preventing pins formations due to the micro-masking phenomenon.

In particular, a method for the patterning of a stack of layers on a surface with high topography is provided, wherein this stack of layers comprises or consists of at least two layers with/and a resist pattern on top of it.

In some cases, only part of said surface with topography steps may be covered by the resist pattern.

The devices of preferred embodiments are achieved by depositing at least one of the layers from the stack thicker than the thickness aimed at in the final stack. Subsequently, and preferably contiguously (i.e. immediately after), said layer is anisotropically etched back to the thickness aimed at in the final stack.

More specifically, the preferred embodiments can involve depositing at least one of the layers from the stack thicker than the thickness aimed at in the final stack. By subsequent anisotropically etching at least one of the layers back to the desired thickness, the slope of the layers next to the topography step is decreased compared to the slope of the underlying topography step on the initial surface. Removal of all layers during subsequent patterning is facilitated, reducing the over-etch to avoid residues in the final stack.

A method according to the preferred embodiments can further involve/comprise the deposition of the rest of the stack, followed by lithographic illumination and resist development.

As the resist pattern is transferred into the final stack during dry etch, the selectivity requirements for the removal of all layers on top of the etched back layer are more relaxed because the slope of topography has been decreased compared to the situation where this layer is not etched back.

In particular, a method of the preferred embodiments for patterning a stack of layers of a semiconductor device comprises, before the step of depositing the resist layer, the step of (i) depositing a layer thicker than the final aimed/intended thickness upon another layer of any one of the materials used in the semiconductor device, contiguously followed by the step of (ii) (anisotropically) etching back said deposited layer to the aimed/intended thickness.

In the context of the preferred embodiments, a layer thicker than the final aimed/intended thickness refers to a thickness increased by a factor of more than about 1, and preferably by a factor of more than about 1.5, or more than about 2, or more than about 3, 4, 5, 10, 100 and more preferably by a factor of from about 1.5 to about 3.

A method of the preferred embodiments can further comprise, still before the step of depositing the resist layer, the step of depositing at least one further layer of any of the materials used in a semiconductor device upon the layer deposited and (anisotropically) etched back in steps (i) and (ii).

A method of the preferred embodiments can further comprise, after the step of depositing the resist layer, a lithographic illumination step and a resist development step.

The resist pattern can then be transferred into the stack of layers, e.g., by a plasma etching step.

A method according to the preferred embodiments can be used for patterning gates, for example in MuGFETs (such as FinFETs, Tri-Gate, Omega-gate, Pie-Gate devices, and the like), in NVM applications or poly emitter patterning in BiCMOS applications.

In a method of the preferred embodiments for patterning (a) gate(s), the layer(s) deposited in step (i) can be (a) poly-Si layer(s), or (a) metal(s) layer(s).

Said poly-Si layer(s) or metal(s) layer(s) can be deposited upon an active area and/or a field oxide.

A method of the preferred embodiments for patterning (a) gate(s) may further comprise the step of depositing a hardmask layer upon said deposited and etched back layer.

Said hardmask layer can be a $SiO_2$ layer, a SiN layer or a SiON layer.

The thickness of the hardmask layer is generally between 30 nm and 150 nm.

A method of the preferred embodiments for patterning (a) gate(s) may further comprise the step of depositing an anti-reflective coating (ARC) layer upon said deposited and etched back layer or upon said hardmask layer.

Preferably, an inorganic anti-reflective coating (ARC) is deposited upon said deposited and etched back layer.

Preferably, an organic anti-reflective coating (ARC) is deposited upon said hardmask layer.

In a first embodiment, the layer deposited and (anisotropically) etched back is a poly-Si layer for gate patterning for Multiple Gate FETs (MuGFETs).

After the growth of the gate oxide, a poly-Si layer is deposited with a higher thickness than aimed in the final stack. Every thickness thicker than the thickness aimed at in the final stack will give a beneficial effect towards the gate patterning using the etchback approach. Preferably this thickness is a factor of about 1.5 to about 3 higher (and can be more than 3 with no upper limit) than the aimed thickness in the final stack. This layer is anisotropically etched back to the desired thickness.

In said first embodiment where a poly-Si layer is etched back to realize gate patterning for MuGFETs, the topography of the surface consists of the active area i.e. source, drain, and fin patterned from an SOI layer.

After the growth of the gate oxide, the deposition and the anisotropic etching of the poly-Si layer, an oxide hard mask layer (e.g. tetraethyl orthosilicate—TEOS—or plasma enhanced chemical vapor deposited—PECVD—oxide) is deposited followed by the coating of an organic ARC. Then the resist layer is deposited.

The methods of preferred embodiments also work when the hard mask layer is omitted and an inorganic ARC (e.g. SiON) or organic BARC is covered with resist.

After resist coating, the wafer is illuminated and the resist developed.

Finally the resist pattern is transferred into the hard mask and the poly-Si layer, stopping on the gate oxide.

In an alternative to the first embodiment, a poly-SiGe layer is (i) deposited thicker than aimed at in the final gate stack on top of a thin poly-Si layer and (ii) said poly-SiGe layer is subsequently and contiguously (anisotropically) etched back to the desired thickness.

The poly-SiGe layer is a sacrificial layer removed later on in the process flow to realize the simultaneous silicidation of active area and gate.

In another alternative of the first embodiment, one, two, or more metal layer(s) can be deposited upon a gate oxide or upon a high-k layer.

At least one of the metal layers is (i) deposited thicker than aimed at in the final gate stack and (ii) subsequently anisotropically etched back to the desired thickness.

Referring to FIG. 1A, a Silicon On Insulator (SOI) wafer is provided for MuGFET applications. The top Si layer is p-type monocrystalline and <100>-oriented and typically 50 to 200 nm.

The buried oxide (BOX) layer (1) is typically 100-200 nm thick. The bulk Si part of the substrate is p-type monocrystalline and <100>-oriented.

The active area, i.e., source, drain, and fin (2) are patterned by conventional processing.

The recess in the buried oxide (BOX) (1) can be a few nanometers up to several tens of nanometers due to hardmask (e.g. oxide) removal after active area etch and by process steps to cure the fin sidewall damage after active area patterning (e.g. anneal in oxidizing ambient and subsequent HF dip).

A typical gate stack used in current MuGFET processing is 60-100 nm poly-Si on top of 1-2 nm gate oxide (3).

Figure 1B:
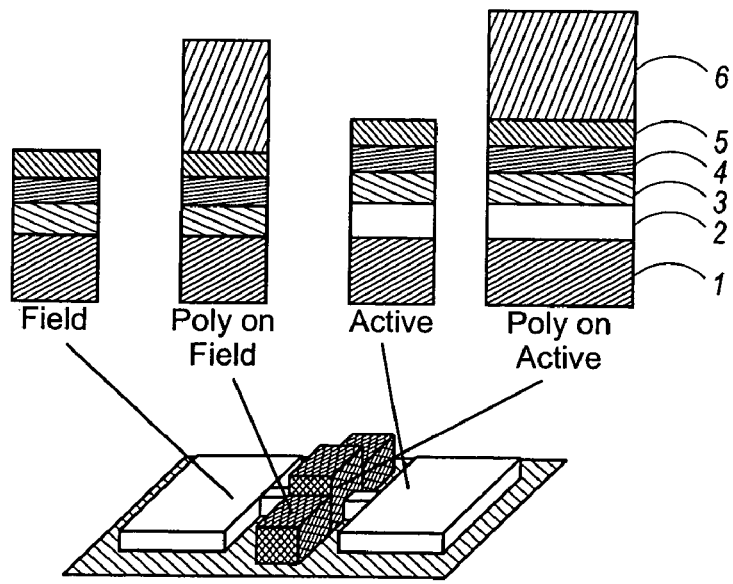
FIG. 1B shows also a poly-Si gate structure for MuGFET, more particularly for FinFET. The layers deposited to fabricate the FinFET structure before etching the FinFET gate are shown. The stack can comprise a buried oxide layer (1), an active area structure (with source, drain and fin) (2), a poly-Si layer (3), a hardmask layer (4), an organic BARC (Bottom Anti-Reflective Coating) layer (5) and a resist layer (6).

FIG. 1B shows the different stack layers before gate etch for MuGFETs. The stack can comprise: a buried oxide layer (1), an active area structure with source, drain and fin (2), a poly-Si layer (3), a hardmask layer (4), an organic BARC (bottom Anti-Reflective coating) layer (5), a resist layer (6).

Figure 2:
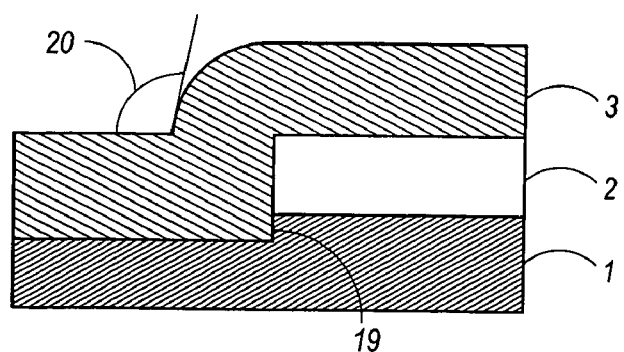
FIG. 2 shows a schematic cross-section after 100 nm poly-Si (3) deposition (gate oxide not shown) on top of 70 nm high active area (2) (comprising the source, gate and fin structures) on a Burried Oxide Layer (BOX) (1) with about 20 nm BOX RECESS (19) in the field area. The total level difference is therefore 90 nm, which is of the order of the thickness of the deposited poly-Si layer. The slope of the surface of the poly-Si layer is also indicated (20).

In FIG. 2, a schematic cross-section is shown after 100 nm poly-Si (3) deposition (gate oxide not shown) on top of 70 nm high active area (2) with about 20 nm BOX RECESS in the BOX layer (1).

The total level difference is therefore 90 nm, which is more than half the thickness of the poly-Si layer (3).

Figure 3A:
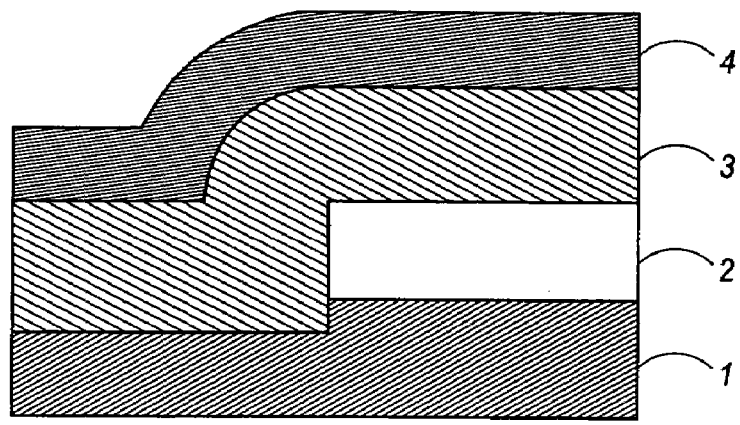
FIGS. 3A-3F show the schematic cross-sections with 100 nm poly-Si deposition (3) and 60 nm oxide hardmask layer (4) on top of the poly-Si layer after performing the gate patterning process without using the etchback approach of the preferred embodiments. This gate patterning leads to micromasking (formation of hardmask spacers).
Figure 3B:
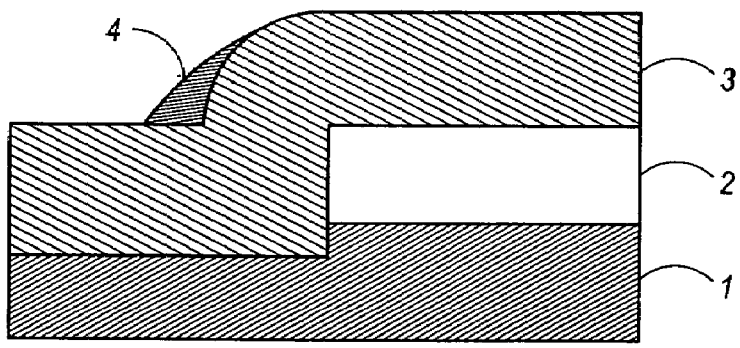
Figure 3C:
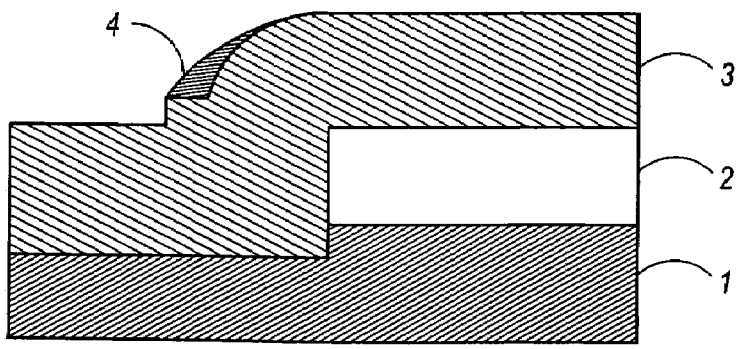
Figure 3D:
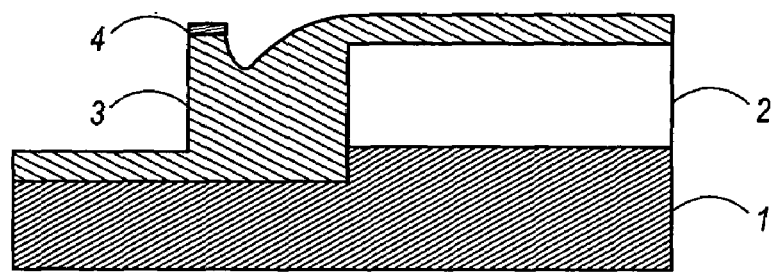
Figure 3E:
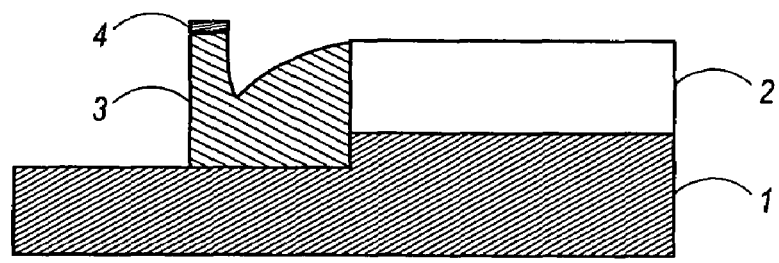
Figure 3F:
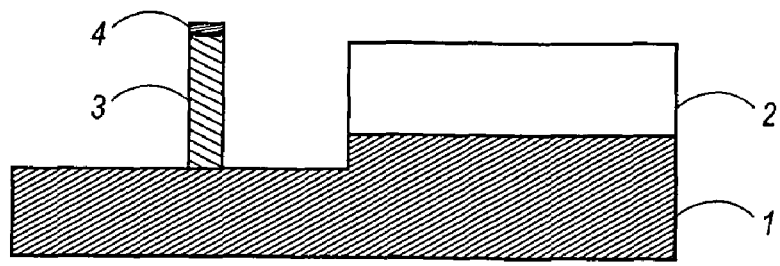
Figures 4A, 4B, 4C:
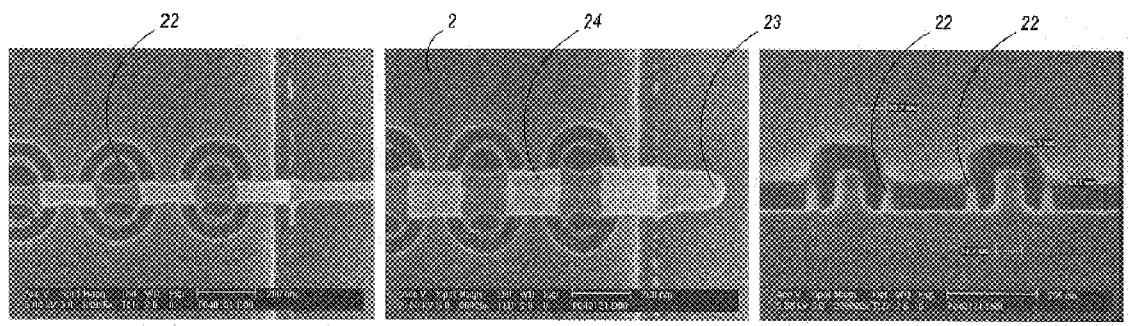
FIGS. 4A to 4F represent SEM pictures of gate patterning without using the etchback approach of the preferred embodiments.
Figure 4D:
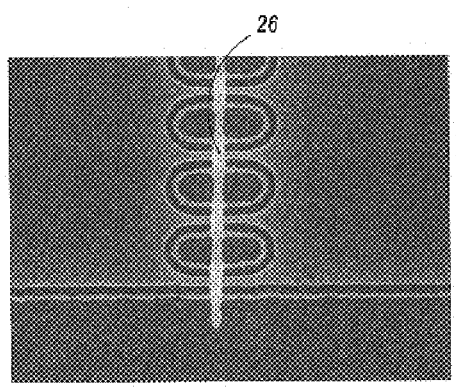
Figure 4E:
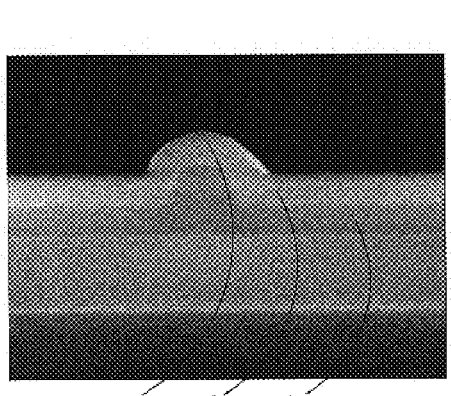
Figure 4F:
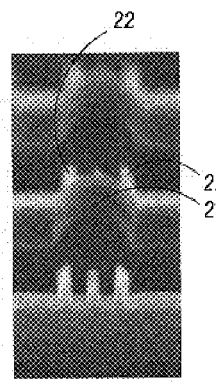

FIGS. 3A-3E show the schematic cross-section with 100 nm poly-Si deposition as shown in FIG. 2 after performing the conventional gate patterning process without using the etchback approach. This conventional gate patterning leads to micromasking. FIG. 3E shows poly-Si residues formed at the position where the slope of the poly-Si layer as seen in FIG. 3A was at its steepest.

Figure 5A:
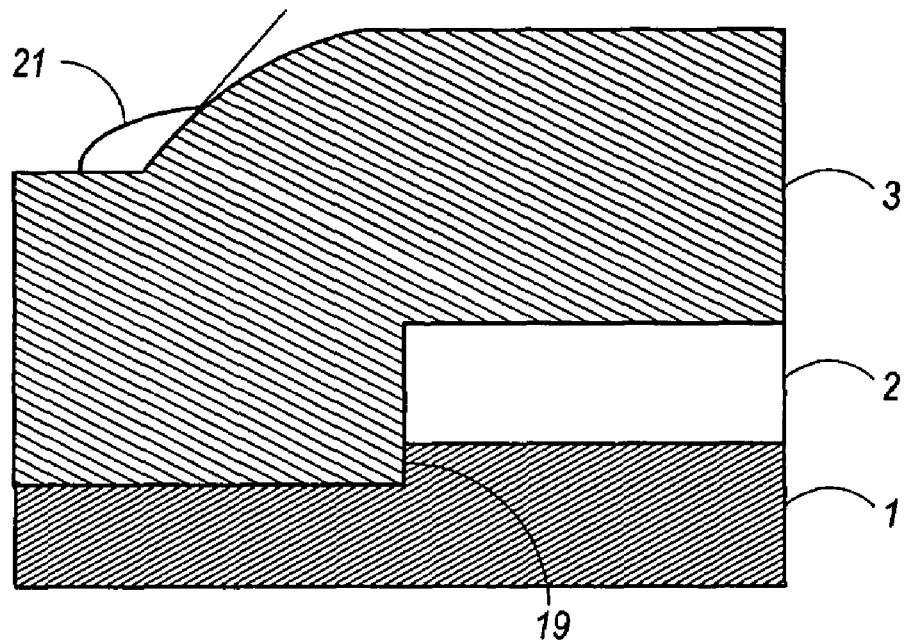
FIG. 5A shows a schematic cross-section after 200 nm poly-Si (3) deposition (gate oxide not shown) on top of 70 nm high active area (2) (comprising the source, gate and fin structures) on a Burried Oxide Layer (BOX) (1) with about 20 nm BOX RECESS (19) in the field area. The slope of the poly-Si surface that is caused by the level difference between active area and field is much less steep for the 200 nm thick poly film than the slope for the 100 nm film (see FIG. 2). A thicker poly-Si layer will lead to a less steep slope or increased angle (21). The slope of the poly-Si surface in FIG. 2 is steeper leading to a smaller angle (20) compared to the angle in FIGS. 5A and 5B.

In FIG. 5A, a schematic cross-section is shown after 200 nm poly-Si deposition. The slope of the poly-Si surface that caused by to the level difference between active area and field is much less steep for the 200 nm thick poly film than the slope for the 100 nm film shown in FIG. 2.

Figure 5B:
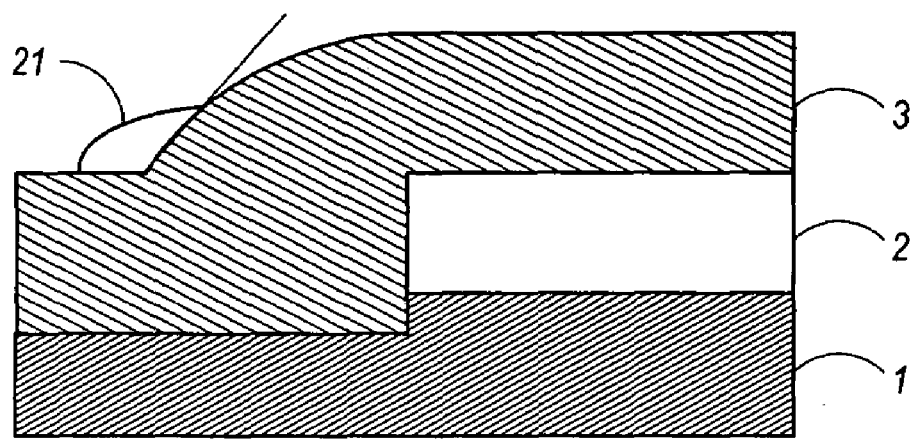
FIG. 5B shows a schematic cross-section after anisotropic etchback of the 200 nm thick poly-Si film (3). A fluorine-based chemistry with bottom power can be used for the etchback. With such chemistry the process can be tuned such that poly-Si and oxide will etch at comparable rate and therefore a break-through step to remove the native oxide is not necessary.
Figures 6A, 6B, 6C:
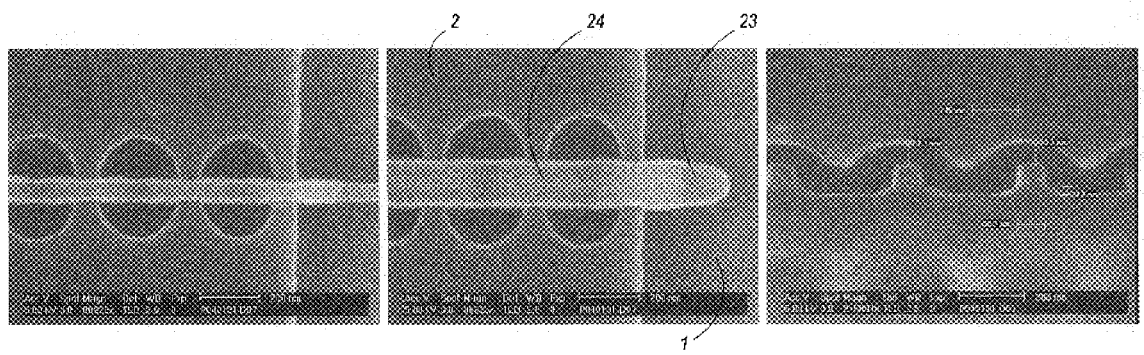
FIGS. 6A to 6F are SEM pictures after gate patterning with the poly-Si-etchback approach (before hardmask removal) of the present preferred embodiments.
Figure 6D:
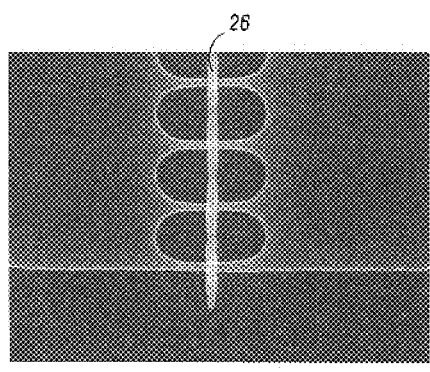
Figure 6E:
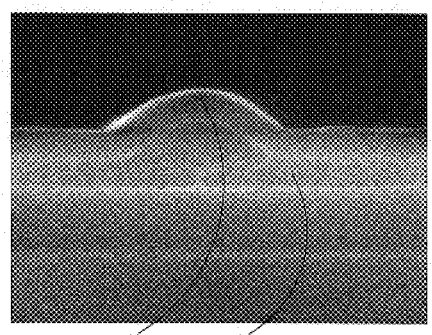
Figure 6F:
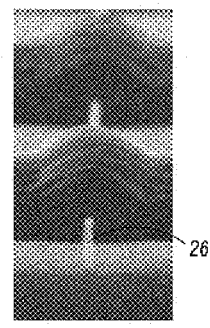

In FIG. 5B, a schematic cross-section is shown after anisotropic etchback of the 200 nm thick poly-Si film.

A fluorine-based plasma (e.g. $CF_4$, $CF_4/CH_2F_2$ chemistry) with bottom power is used for the etchback.

With such chemistry, poly-Si and oxide will etch at comparable rate and therefore a break-through step to remove the native oxide is not necessary.

The poly-Si removal can be done on time, based on blanket wafer etch rate tests or in a more reproducible manner using Interferometric EndPoint (IEP) triggering.

After the etchback method of the preferred embodiments, one can proceed with the conventional gate patterning process steps starting with the deposition of hardmask layer.

Typical examples of hardmask layers that can be used here are oxide (e.g. TEOS, PECVD oxide), SiON, or nitride.

The thickness of the hardmask layer is typically between 30 nm and 150 nm.

Subsequently an organic anti-reflective coating (ARC) is deposited with a thickness of about 77 nm and a resist layer with a thickness of about 230 nm followed by lithography (e.g. 193 nm lithography).

The gate-etch starts with a BARC opening step. This step is on endpoint and is followed by an over-etch step with the same chemistry. Subsequently the resist can be trimmed to reduce the Critical Dimension (CD) before the pattern is transferred into the hard mask using, e.g., a fluorine-based chemistry.

The hard mask opening step (or Break-Through step—BT) uses endpoint triggering with an additional over-etch step (BT-OE).

After the resist pattern is transferred into the hard mask, the wafer can be exposed to an isotropic fluorine based plasma (e.g., $CF_4$) to trim down the CD before transferring the pattern into the poly-Si layer (HardMask Trim or HMT).

When the etchback approach is not used, the oxide hardmask spacers are more difficult to remove—a longer BT-OE and HMT time are needed. Such spacers eventually lead to silicon residues (pins) after the full gate etch procedure. When a longer BT-OE and HMT time are needed then the selectivity towards resist/BARC and poly-Si becomes more critical: the resist pattern should not be damaged nor the poly-Si layer recessed too much.

The poly-Si residues are schematically shown in FIGS. 3A, 3B, 3C, 3D and 3E wherein the conventional gate patterning was performed.

After HMT, the resist can be stripped in a $SF_6/O_2$ plasma or this strip can also be done at the end of the gate etch. The gate etch continues with an anisotropic bulk poly-Si etch step using an $HBr/Cl_2$ chemistry selective to the oxide HM (hard mask), but not selective enough to stop on the gate oxide. Therefore, the final part of the bulk poly-Si etch is done with a $HBr/O_2$ plasma triggering on EP (End Point (Detection)). At this stage, poly-Si spacers have formed at next to active area. In order to remove these spacers two types of OE are used $HBr/O_2$ and $HBr/O_2/He$ both sufficiently selective to gate oxide. These chemistries are not suitable for bulk Si etch because of their poor profile control and in the latter case very slow etch rate for blanket poly-Si.

In FIG. 4, the resulting structure after conventional gate patterning is shown.

FIG. 6 shows the resulting structure after gate patterning using the etchback approach.

In both cases the poly-Si layer was 60 nm thick and an oxide HM of 60 nm was used.

The SEM images are taken after the oxide HM was removed.

Both Figures show structures that have been etched with the same gate etch recipe and have exactly the same topography before gate patterning. For the conventional gate patterning (FIG. 4), micromasking occurs next to topography steps due to oxide spacers remaining after breakthrough overetch (BT-OE) and hardmask trim (HMT) as shown in FIG. 4. In FIG. 4, it is also clear that the poly-Si 'pins' are formed at the position where the slope of the poly-Si surface was at its steepest.

With the poly-Si-etchback approach of the preferred embodiments, this slope is reduced, facilitating the removal of the oxide hardmask spacer and thus less breakthrough over-etch (BT-OE) and hardmask trim (HMT) are necessary.

The etchback approach of the preferred embodiments has several advantages for gate etching for MuGFETs.

One advantage is less BT-OE and HMT are needed in order to remove hard mask spacers next to topography steps on the etched back poly-Si surface. Therefore the process becomes more robust (the resist pattern is less exposed to the BT plasma if the BT-OE is shorter) and more flexible (shorter HMT times are allowed and therefore a wider range on the CD target).

Another advantage relates to the reduced slope of the patterned surface (in this case top surface of the poly-Si gate), which can be helpful for further processing steps e.g. spacer etch.

For example, see FIG. 7A, a top down SEM picture is shown for gate patterning without etch back approach followed by nitride spacer etch and Ni silicidation in comparison with FIG. 7B showing a structure resulting from a method of the preferred embodiments for gate patterning with the etchback approach, and using the same nitride spacer etch recipe and Ni silicidation as in FIG. 7A.

With the etchback approach of the preferred embodiments, the top of the gate is a continuous silicide line. In the conventional case, the residual nitride on top of the gate near topography steps causes an interruption of the silicide, which is not acceptable.

In a second embodiment, a poly-Si layer is etched back to realize the patterning of the control gate in Non-Volatile Memory applications.

The topography of the surface consists of the floating gate and the active-field level difference together with the STI ditch.

After the growth of a gate oxide or high-k layer, a poly-Si layer is deposited that is thicker than the thickness that is aimed at in the control gate stack.

Every thickness thicker than the thickness aimed at in the final stack will give a beneficial effect towards the gate patterning using the etchback approach.

Preferably this polySi layer is deposited to reach a thickness which is a factor 1.5 to 3 higher than the aimed thickness in the final stack (but can be more than 3 with no upper limit), and most preferred a thickness between a factor 2 to 3 higher than the aimed thickness in the final stack.

This layer is anisotropically etched back to the desired thickness.

Subsequently, a hard mask layer is deposited followed by the coating of an organic ARC and resist. The wafer is illuminated and the resist developed.

Finally the resist pattern is transferred into the hard mask and the poly-Si layer stopping on the gate oxide with endpoint triggering.

The layer materials in this embodiment can be changed using a different type of hard mask or using an inorganic ARC without hard mask.

The deposited and etched back layer can be a metal(s) layer or can be a poly-SiGe layer.

In said second embodiment the etchback approach is applied to the patterning of the control gate stack in NVM applications.

Figure 8:
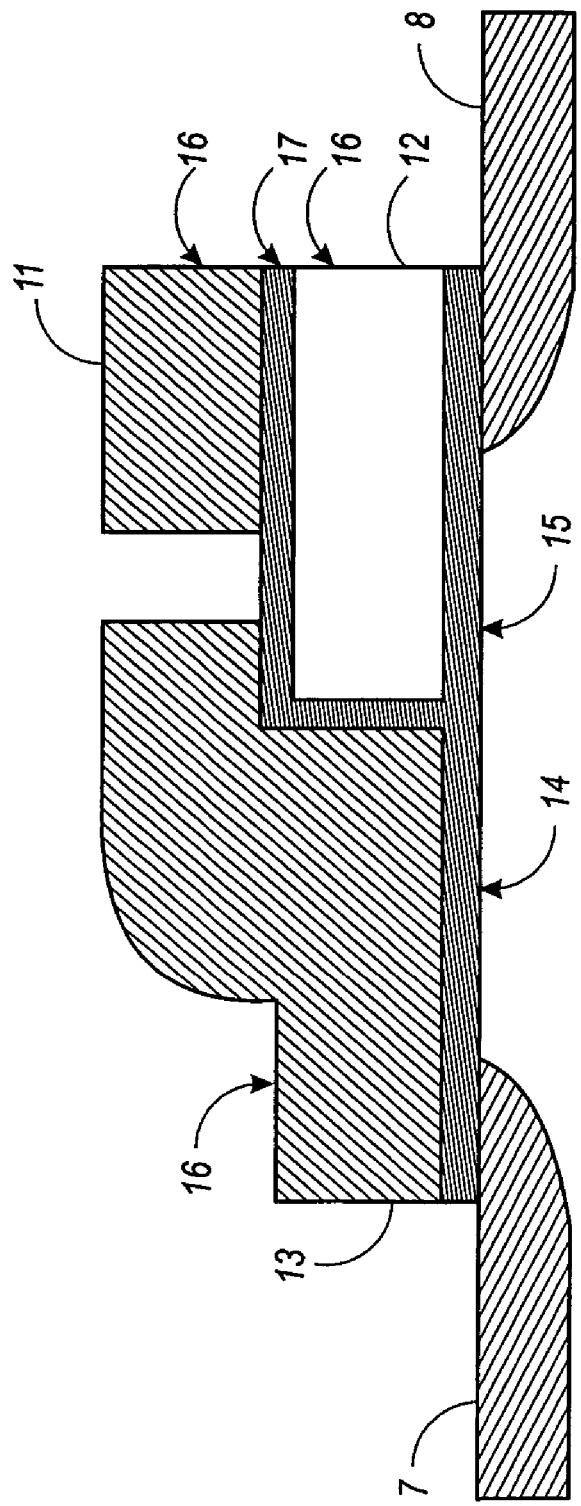
FIG. 8 shows a schematic overview of a Non-Volatile Memory (NVM) cell consisting of floating gate (12), control gate (13), and program gate (11) made of poly-silicon (16). Also shown in FIG. 8 are a source (7), a drain (8), a gate oxide (14), a tunnel oxide (15) and an inter poly Si dielectric layer (17).

In FIG. 8 a schematic overview is shown of a NVM cell consisting of a floating gate (12), control gate (13) and program gate (11). In the example used to demonstrate the preferred embodiments, an NMV architecture was used where the control and program gate are patterned simultaneously.

The height of the floating gate is of the order of 125 nm but this depends on the technology node specifications.

The floating gate is patterned with conventional processing, resulting in a sloped profile (typically from about 80 to about 85 degrees). This is the initial surface at the beginning of the control gate patterning module.

First an inter-poly dielectric of a few nanometers is deposited that acts as a stopping layer for the control gate etch: an oxide-nitride-oxide stack or a high-k layer.

A poly-Si layer of 300 nm is deposited and anisotropically etched back to 150 nm, which is the target thickness in the conventional process.

Subsequently an oxide hard mask of 60 nm is deposited.

Next, an organic ARC (77 nm) and the resist (280 nm) are coated followed by 193-nanometer lithography.

The control/program gate etch recipe is built up the same way as for MuGFETs, but adapted to the relevant poly-Si thickness.

In FIG. 9A the result of conventional gate patterning is compared with gate patterning using the etchback approach (FIG. 9B). Due to micromasking, additional poly-Si structures appear parallel to the topography caused by the floating gate and STI ditch. Using the etchback approach of the preferred embodiments, no such structures are present and therefore the control/program gate patterning is successful.

In a third embodiment, this method can be applied to etch back a poly-Si layer to realize the patterning of the doped poly-Si emitter level in BiCMOS.

Bipolar devices are typically processed after CMOS processing. This means that there is CMOS topography present on the wafer: the CMOS gate with a spacer on the side. For the 0.13 µm technology mode, the gate height is of the order of 100 nm to 150 nm. Making a bipolar transistor can result in additionally topography steps, e.g., if a patterning step is used to cover the CMOS area and to define the active regions where the bipolar is formed. To make a bipolar device, base and emitter need to be patterned (the substrate usually acts as collector).

The base is patterned from a Si film grown epitaxially on the active area of the BiCMOS area. On the seed layer of the CMOS area this film grows poly-crystalline.

The emitter etch stack preferably consists of organic ARC (e.g., about 80 nm), a doped poly-Si film (e.g., about 150 nm) and a nitride layer (e.g., about 20 nm), stopping on oxide.

Using the etchback approach of the preferred embodiments, the doped poly-Si layer is deposited thicker than the thickness that is aimed at in the poly emitter stack.

Every thickness thicker than the thickness aimed at in the final stack will give a beneficial effect using the etchback approach of the preferred embodiments. Preferably this thickness is a factor of about 1.5 to 3 higher than the aimed thickness in the final stack (but can be more than 3 with no upper limit) and most preferred a thickness in between a factor 2 to 3 higher than the aimed thickness in the final stack is used.

This layer is anisotropically etched back to the desired thickness. As a consequence the over-etch, performed to remove ARC spacers at topography steps, can be reduced.

EXAMPLE

Different recipe steps were employed in a Poly-Si Gate etch for MuGFET (e.g., FinFET).

The stack consisted of 100 nm poly-Si/60 nm oxide/77 nm BARC/230 nm resist (standard 193 nm resist). The 100 nm poly-Si film was etched back from a 200 nm thick poly-Si film before HM deposition and litho.

The etchback recipe is summarized in Table 1. The recipe consisted of one step of 46 seconds with a chemistry typically used for break-through of the hard mask in gate etch. The etch rate was 134 nm/min for poly-Si (158 nm/min for oxide). The tool used was a Versys 2300 dry etch chamber on a LAM Domino etch tool.

TABLE 1

| Step Description | BT-EP |
|---|---|
| Pressure (mTorr) | 10 |
| Pressure (mbar) | 0.01333 |
| TCP_RF Power(W) | 800 |
| Bias_RF power (W) | 85 |
| Bias_RF voltage (V) | 0 |
| Bias_RF control Mode | Power |
| Bias_power Learned (W) | 84.9 |
| $CF_4$ (200) | 200 |
| He (500) | 0 |
| $CH_2F_2$ (100) | 25 |
| Step type | Time |
| Process Time (sec) | 46 |
| Over-etch (%) | 0 |

The thickness of the poly-Si layer before etching the gate was 200 nm ($3\sigma=11$ nm). After dry and anisotropic etchback, the aimed thickness of the poly-Si layer was 100 nm and the measured thickness was 97 nm ($3\sigma=9$ nm).

All references cited herein are incorporated herein by reference in their entirety. To the extent publications and patents or patent applications incorporated by reference contradict the disclosure contained in the specification, the specification is intended to supersede and/or take precedence over any such contradictory material.

The term "comprising" as used herein is synonymous with "including," "containing," or "characterized by," and is inclusive or open-ended and does not exclude additional, unrecited elements or method steps.

All numbers expressing quantities of ingredients, reaction conditions, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present invention. At the very least, and not as an attempt to limit the application of the doctrine of equivalents to the scope of the claims, each numerical parameter should be construed in light of the number of significant digits and ordinary rounding approaches.

The above description discloses several methods and materials of the present invention. This invention is susceptible to modifications in the methods and materials, as well as alterations in the fabrication methods and equipment. Such modifications will become apparent to those skilled in the art from a consideration of this disclosure or practice of the invention disclosed herein. Consequently, it is not intended that this invention be limited to the specific embodiments disclosed herein, but that it cover all modifications and alternatives coming within the true scope and spirit of the invention as embodied in the attached claims.

What is claimed is:

1. A method for patterning a gate into a stack of layers of a semiconductor device, the method comprising the steps of:
depositing a layer on a stack having a topographic step, wherein a thickness of the layer is greater than a final aimed thickness of the layer; contiguously followed by anisotropically etching back the layer to the aimed thickness, whereby a slope of the topographic step is decreased, and wherein an intervening etch-stopping layer is not present under the anisotropically etched back layer; thereafter
depositing an anti-reflective coating layer upon the etched back layer;
depositing a resist layer atop the stack;
patterning the resist layer by lithographically illuminating the resist layer and developing the resist, whereby a resist pattern is obtained;
transferring the resist pattern into the stack, whereby a patterned stack of layers is obtained; and thereafter
removing the resist layer without leaving residues in the patterned stack of layers.

2. The method according to claim 1, further comprising:
depositing at least one further layer of the stack upon the etched back layer, wherein the step is conducted before the step of depositing the resist layer.

3. The method according to claim 1, wherein the layer is selected from the group consisting of a poly-silicon layer, a metal-containing layer, a poly-SiGe layer, a nitride layer, and an oxide layer.

4. The method according to claim 1, wherein the stack comprises at least one topographic step having a thickness of at least half a thickness of a layer of the stack to be patterned.

5. The method according to claim 1, wherein a layer of the stack is at least one of an active area and a field oxide.

6. The method according to claim 1, wherein the gate is a multi-gate field effect transistor or a non-volatile memory gate.

7. A method for patterning a stack of layers of a semiconductor device, the method comprising the steps of:
depositing a layer on a stack having a topographic step, wherein a thickness of the layer is greater than a final aimed thickness of the layer; contiguously followed by anisotropically etching back the layer to the aimed thickness, whereby a slope of the topographic step is decreased, and wherein an intervening etch-stopping layer is not present under the anisotropically etched back layer; thereafter
depositing a hardmask layer upon the etched back layer;
depositing an anti-reflective coating layer upon the hardmask layer;
depositing a resist layer atop the stack;
patterning the resist layer by lithographically illuminating the resist layer and developing the resist, whereby a resist pattern is obtained;
transferring the resist pattern into the stack, whereby a patterned stack of layers is obtained; and thereafter
removing the resist layer without leaving residues in the patterned stack of layers.

8. The method according to claim 7, wherein the hardmask layer is selected from the group consisting of an oxide layer, a SiON layer, and a nitride layer.

9. A method for patterning a stack of layers of a semiconductor device, the method comprising the steps of:
depositing a layer on a stack having a topographic step, wherein a thickness of the layer is greater than a final aimed thickness of the layer; contiguously followed by anisotropically etching back the layer to the aimed thickness, whereby a slope of the topographic step is decreased, and wherein an intervening etch-stopping layer is not present under the anisotropically etched back layer; thereafter
depositing a resist layer atop the stack;
patterning the resist layer by lithographically illuminating the resist layer and developing the resist, whereby a resist pattern is obtained;

transferring the resist pattern into the stack, whereby a patterned stack of layers is obtained; and thereafter removing the resist layer without leaving residues in the patterned stack of layers, wherein the stack is patterned to form an emitter in a bipolar device.

10. A semiconductor device prepared by a method according to claim 1.

11. The method according to claim 8, further comprising:
depositing at least one further layer of the stack upon the etched back layer, wherein the step is conducted before the step of depositing the resist layer.

12. The method according to claim 8, wherein the layer is selected from the group consisting of a poly-silicon layer, a metal-containing layer, a poly-SiGe layer, a nitride layer, and an oxide layer.

13. The method according to claim 8, wherein the stack comprises at least one topographic step having a thickness of at least half a thickness of a layer of the stack to be patterned.

14. A semiconductor device prepared by a method according to claim 8.

15. The method according to claim 9, further comprising:
depositing at least one further layer of the stack upon the etched back layer, wherein the step is conducted before the step of depositing the resist layer.

16. The method according to claim 9, wherein the layer is selected from the group consisting of a poly-silicon layer, a metal-containing layer, a poly-SiGe layer, a nitride layer, and an oxide layer.

17. The method according to claim 9, wherein the stack comprises at least one topographic step having a thickness of at least half a thickness of a layer of the stack to be patterned.

18. A semiconductor device prepared by a method according to claim 9.

* * * * *